United States Patent
Bonaccio et al.

(10) Patent No.: US 7,053,712 B2
(45) Date of Patent: May 30, 2006

(54) METHOD AND APPARATUS FOR CONTROLLING COMMON-MODE OUTPUT VOLTAGE IN FULLY DIFFERENTIAL AMPLIFIERS

(75) Inventors: Anthony R. Bonaccio, Burlington, VT (US); Hayden C. Cranford, Jr., Cary, NC (US); Michael A. Sorna, Hopewell Junction, NY (US); Sebastian T. Ventrone, South Burlington, VT (US)

(73) Assignee: International Business Machines Corporation, Armonk, NY (US)

( * ) Notice: Subject to any disclaimer, the term of this patent is extended or adjusted under 35 U.S.C. 154(b) by 46 days.

(21) Appl. No.: 10/710,745

(22) Filed: Jul. 30, 2004

(65) Prior Publication Data

US 2006/0022753 A1 Feb. 2, 2006

(51) Int. Cl.
*H03F 3/45* (2006.01)
(52) U.S. Cl. ..................... 330/258; 330/253
(58) Field of Classification Search ........... 330/258, 330/253, 259, 257, 260, 261
See application file for complete search history.

(56) References Cited

U.S. PATENT DOCUMENTS

| | | | |
|---|---|---|---|
| 6,064,262 A * | 5/2000 | Wang ..................... 330/253 |
| 6,140,877 A * | 10/2000 | Forbes ..................... 330/258 |
| 6,281,753 B1 * | 8/2001 | Corsi et al. .............. 330/261 |
| 6,297,698 B1 | 10/2001 | Callahan, Jr. |
| 6,452,448 B1 | 9/2002 | Bonaccio et al. |
| 6,525,608 B1 | 2/2003 | Krupnik |
| 2001/0045865 A1 | 11/2001 | Shulman |
| 2003/0201825 A1 | 10/2003 | Kwan et al. |

OTHER PUBLICATIONS

James Karki, "Fully-Differential Amplifiers;" Texas Instruments Application Report, SLOA054D—Jan. 2002.
Art Kay, "Increase Common-Mode Range for Fully Differential Amplifiers;" found at http://www.elecdesign.com/articles/index.cfm?articleID=5395.

* cited by examiner

*Primary Examiner*—Henry Choe
(74) *Attorney, Agent, or Firm*—Michael J. LeStrange; Cantor Colburn LLP

(57) ABSTRACT

A method for controlling the common-mode output voltage in a fully differential amplifier includes comparing a sensed common-mode output voltage of the fully differential amplifier to a reference voltage, and generating an error signal representing the difference between the sensed common-mode output voltage and the reference voltage. The error signal is utilized to control the body voltage of one or more FET devices included within the fully differential amplifier until the sensed common-mode output voltage is in agreement with said reference voltage.

26 Claims, 5 Drawing Sheets

METHOD AND APPARATUS FOR CONTROLLING COMMON-MODE OUTPUT VOLTAGE IN FULLY DIFFERENTIAL AMPLIFIERS

BACKGROUND OF INVENTION

The present invention relates generally to amplifier circuits, and, more particularly, to a method and apparatus for controlling common-mode output voltage in fully differential amplifiers.

Differential signaling has been commonly used in audio, data transmission and telephone systems for many years because of its inherent resistance to external noise sources. More recently, differential signaling has become popular in high-speed data acquisition wherein, for example, differential amplifiers are used to drive inputs of analog to digital converters. In particular, a fully differential amplifier is a differential amplifier that, in addition to differential inputs, also includes differential outputs (as opposed to a single-ended output of standard operational amplifier). For example, the input and output differential signals may be voltage signals centered about $(V_{CC}-V_{SS})/2$, within the range $(V_{SS}, V_{CC})$, wherein $V_{SS}$ is a substrate voltage and $V_{CC}$ is a power rail (or core) voltage. Such devices provide increased immunity to external common-mode noise, reduced even-order harmonics, and twice the output swing for a given voltage limit as compared to single-ended systems.

With a fully differential amplifier, a common-mode feedback loop is used to set the common-mode voltage at the output of the amplifier. One technique for achieving this is to add auxiliary current sources to the active load in the differential amplifier and to control the gates/bases of the auxiliary sources with a feedback loop that adjusts the voltage on the gates/bases until the common-mode voltage at the output of the amplifier matches a reference input to the feedback loop. This in turn results in the use of additional current source devices that increase area and capacitive loading on the output nodes of the fully differential amplifier.

Accordingly, it would be desirable to be able to implement a means for controlling the common-mode voltage in a fully differential amplifier structure without utilizing auxiliary current sources in the common-mode feedback loop, thereby saving device real estate.

SUMMARY OF INVENTION

The foregoing discussed drawbacks and deficiencies of the prior art are overcome or alleviated by a method for controlling the common-mode output voltage in a fully differential amplifier. In an exemplary embodiment, the method includes comparing a sensed common-mode output voltage of the fully differential amplifier to a reference voltage, and generating an error signal representing the difference between the sensed common-mode output voltage and the reference voltage. The error signal is utilized to control the body voltage of one or more FET devices included within the fully differential amplifier until the sensed common-mode output voltage is in agreement with said reference voltage.

In another embodiment, an apparatus for controlling the common-mode output voltage in a fully differential amplifier includes a sensing scheme for determining a sensed common-mode output voltage of the fully differential amplifier. An error amplifier compares the sensed common-mode output voltage to a reference voltage, the error amplifier configured to generate an error signal representing the difference between the sensed common-mode output voltage and the reference voltage. The error signal is coupled to a body terminal of one or more FET devices included within the fully differential amplifier so as to control the body voltage thereof until the sensed common-mode output voltage is in agreement with the reference voltage.

In still another embodiment, a method for controlling the common-mode output voltage in a fully differential amplifier includes comparing a sensed common-mode output voltage of the fully differential amplifier to a desired common-mode output voltage, and generating an error signal representing the difference between the sensed common-mode output voltage and the reference voltage. The error signal is utilized as an input to a coarse feedback loop, the coarse feedback loop coupled to a reference current mirror in the fully differential amplifier. The error signal is further utilized as an input to a fine feedback loop, the fine feedback loop configured to control the body voltage of one or more FET devices included within the reference current mirror until the sensed common-mode output voltage is in agreement with the desired common-mode output voltage.

In still another embodiment, an apparatus for controlling the common-mode output voltage in a fully differential amplifier includes a sensing scheme for determining a sensed common-mode output voltage of the fully differential amplifier. An error amplifier compares the sensed common-mode output voltage to a reference voltage, the error amplifier configured to generate an error signal representing the difference between the sensed common-mode output voltage and the reference voltage. The error signal is utilized as an input to a coarse feedback loop, the coarse feedback loop coupled to a reference current mirror in the fully differential amplifier. The error signal is further utilized as an input to a fine feedback loop, the fine feedback loop configured to control the body voltage of one or more FET devices included within the reference current mirror until the sensed common-mode output voltage is in agreement with the desired common-mode output voltage.

BRIEF DESCRIPTION OF DRAWINGS

Referring to the exemplary drawings wherein like elements are numbered alike in the several Figures.

DETAILED DESCRIPTION

Disclosed herein is a method and apparatus for controlling common-mode voltage in fully differential amplifiers, without the use of auxiliary current sources in the (fine) error feedback loop. Briefly stated, in the present invention embodiments, the common-mode output voltage of a fully differential amplifier is controlled by modulating the body voltage of devices already present in the amplifier, as opposed to adding more devices (i.e., current sources) for the specific purpose of common-mode control. It is assumed that in a triple-well bulk or SOI CMOS technology, for example, access to the body terminals of both N-type and P-type devices is available. Alternatively, at least one embodiment is shown in which only the P-type device bodies are controlled/adjusted. It should also be appreciated that such an embodiment would also be applicable to a traditional N-well CMOS technology.

Figure 1:
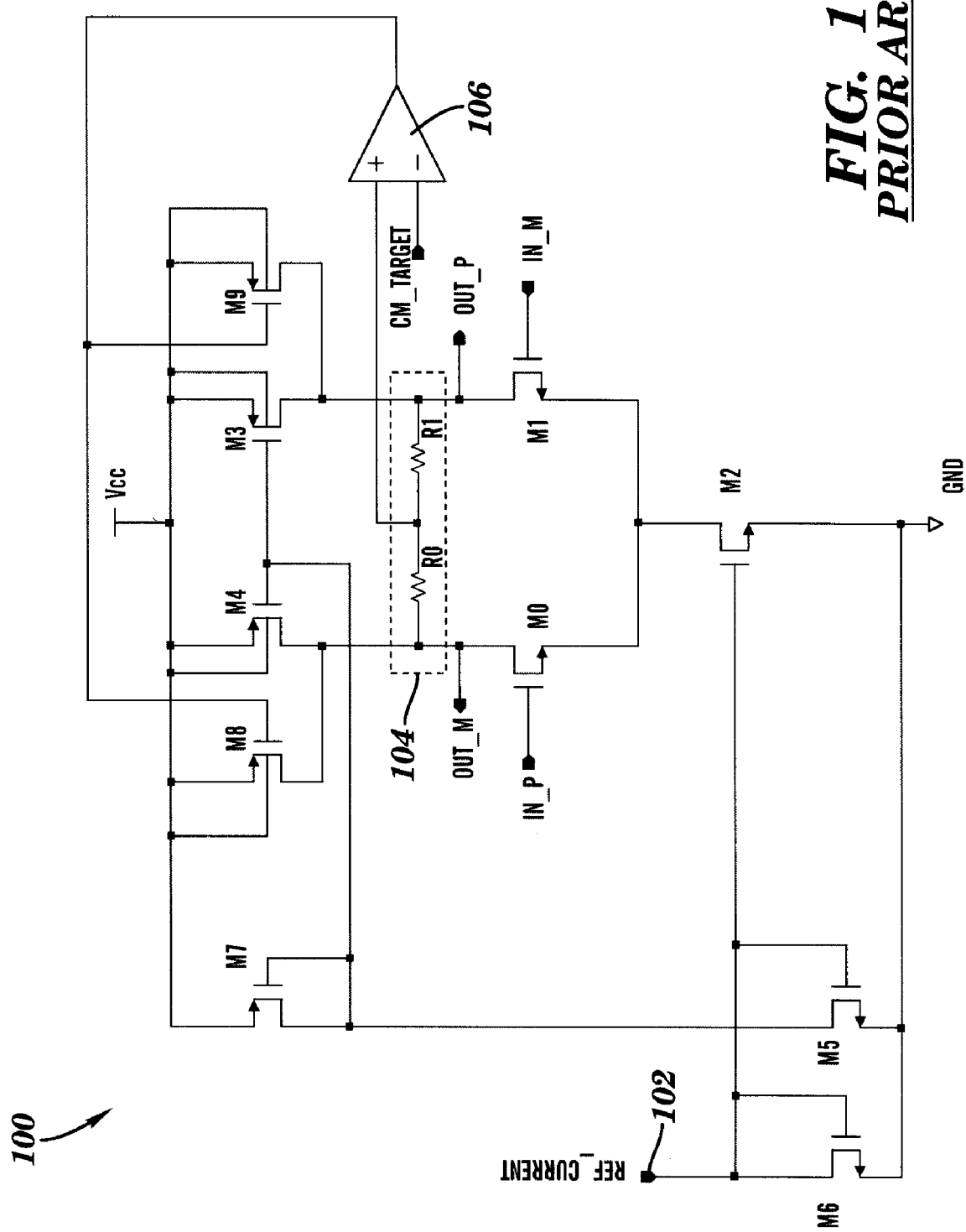
FIG. 1 is a schematic diagram of an existing fully differential amplifier, featuring the use of auxiliary current sources in the error feedback loop.

Referring initially to FIG. 1, there is shown a schematic diagram of a conventionally controlled fully differential amplifier 100. As is shown, the amplifier 100 includes a reference current source 102, and current mirror devices (NFETs) M6, M2, M5 and (PFETs) M7, M4, M3, M8 and M9. The differential input terminals IN_P, IN_M of amplifier 100 are coupled to the gates of NFETs M0 and M1, respectively, while the differential output terminals OUT_M, OUT_P of amplifier 100 are coupled to the drain terminals of M0 and M1, respectively. In order to determine the output common-mode voltage of the amplifier 100, a common-mode sensing network 104 (e.g., a resistive divider including resistors R0 and R1) is connected differentially across the output terminals. This configuration develops the common-mode voltage at the center tap point of the two equally valued resistors. However, other common-mode sensing schemes as known in the art may also be used.

In any case, the sensed common-mode output voltage is coupled to the inverting terminal of a common-mode error operational amplifier 106, which compares the sensed common-mode voltage to a reference voltage (CM_TARGET) and drives a feedback path such that the common-mode output voltage is adjusted to match the reference voltage. In the conventional configuration of FIG. 1, the output of error amplifier 106 is used to drive the gates of additional contributing PFET current source devices M8 and M9. The bulk of the PFET load conductance of the amplifier 100 is thus controlled in an open-loop manner by current mirror devices M4 and M3.

Figure 2:
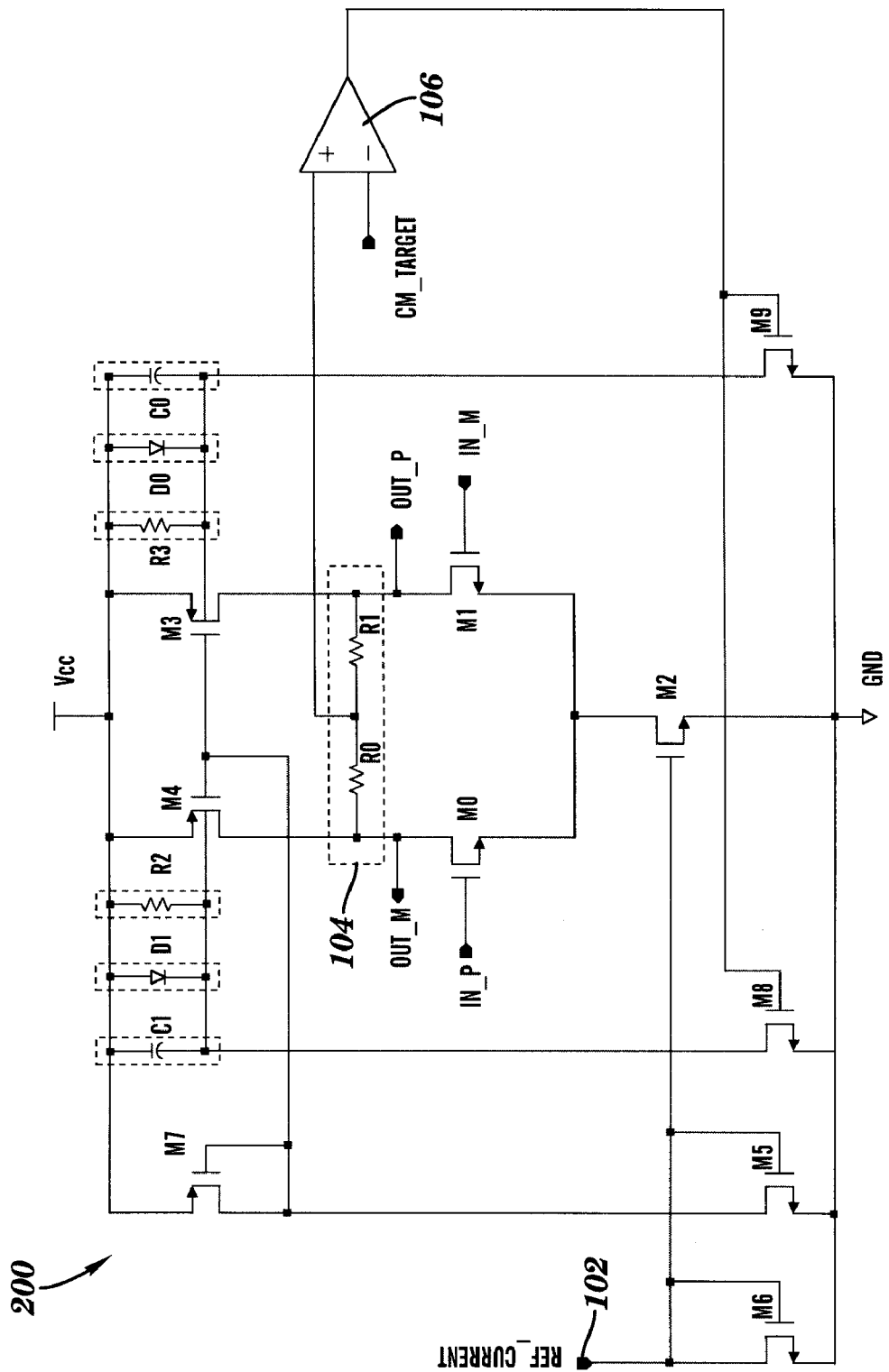
FIG. 2 is a schematic diagram of fully differential amplifier, utilizing feedback control of the body voltage of devices already present therein, accordance with an embodiment of the invention.

As indicated previously, the additional current source provided by the combination of M8 and M9 for open-loop control represents devices that increase the overall area of the amplifier, as well as adds to the capacitive loading on the output nodes of the amplifier. Therefore, in accordance with an embodiment of the invention, FIG. 2 is a schematic diagram of a fully differential amplifier 200, in which the output of the common-mode error operational amplifier 106 is used to adjust the body voltage of FET devices already included within the amplifier topology. In the specific embodiment illustrated, the output of the common-mode error operational amplifier 106 is connected to a pair of inverting amplifiers, NFETs M8 and M9, which in turn are coupled to the body terminals of load PFETs M4 and M3, respectively. Accordingly, depending on whether the sensed common-mode output voltage is above or below the reference voltage (CM_TARGET), the corresponding change in body potential of M4 and M3 will increase or decrease the voltage threshold thereof, thus altering the conductivity of M4 and M3 until the sensed common-mode voltage matches the reference voltage.

For example, if the sensed common-mode output voltage exceeds the reference voltage, the output of error amplifier 106 will increase the conductivity of M8 and M9, thus lowering the body potential of M4 and M3. This in turn increases the threshold voltage of those PFETs, rendering them less conductive and thereby causing the sensed common-mode voltage to decrease. Conversely, if the sensed common-mode output voltage is less than the reference voltage, the output of error amplifier 106 will decrease the conductivity of M8 and M9, thus raising the body potential of M4 and M3. This in turn decreases the threshold voltage of the load PFETs, rendering them more conductive and thereby causing the sensed common-mode voltage to increase. In this embodiment, the maximum body potential for PFETs M3 and M4 is Vcc. This voltage is reached when M8 and M9 are turned completely off by the error amplifier. To ensure that the loop range is not restricted by this upper limit, the conductance respectively of M3 and M4 is nominally set relative to the conductance of M7 so that the body voltage required to balance the loop is always less than Vcc. This can be accomplished by making the widths of M3 and M4 slightly larger than the width of M7 so that the common-mode output voltage is always too high when M8 and M9 are off. This technique essentially adds a pre-bias or systematic common-mode offset to the loop.

As is also shown in FIG. 2, a pair of load resistors R2, R3, is provided for inverting amplifiers M8 and M9. In addition, because the body voltages of M4 and M3 are adjustable, a clamping device is used to prevent the body-to-diffusion diodes present in M4 and M3 from being turned on. In the embodiment depicted, this function is implemented through a pair of clamping diodes D1, D0, although any number of known clamping schemes could also be used. Furthermore, a frequency-compensating device is provided, as implemented in FIG. 2 by capacitors C1, C0. The capacitors are used in order to set a dominant pole in the common-mode feedback loop to prevent it from oscillating spuriously. Again, more sophisticated frequency compensation methods as known in the art could also be used.

Figure 3:
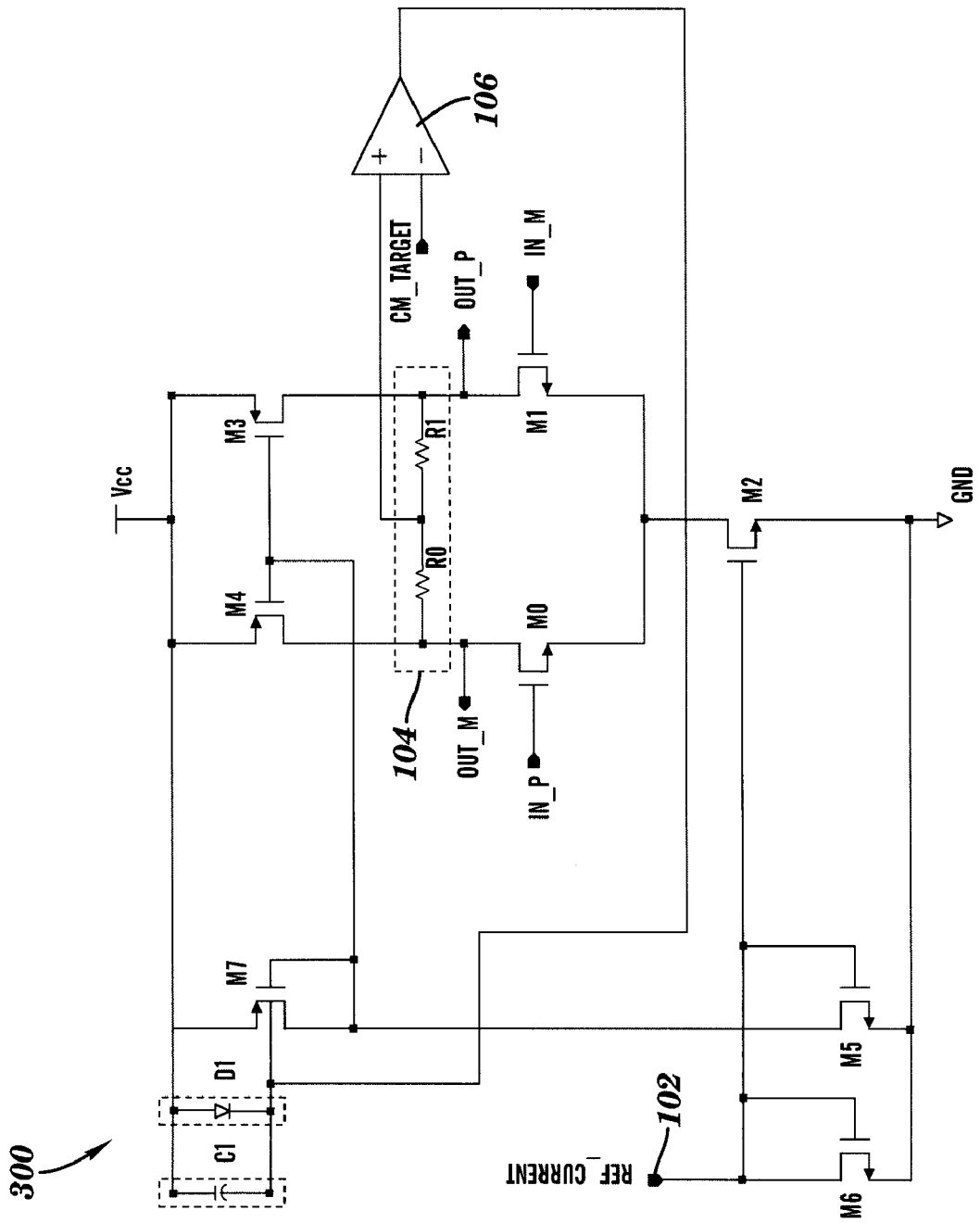
FIG. 3 is a schematic diagram of an alternative embodiment of the fully differential amplifier of FIG. 2.

FIG. 3 is a schematic diagram of a fully differential amplifier 300, in accordance with an alternative embodiment of the invention. As is with the case of the circuit of FIG. 2, the output of the common-mode error operational amplifier 106 is also used to control FET body voltage. In this example, however, the body potential of PFET reference device M7 is coupled to the output of error amplifier instead of PFETs M4 and M3. This provides a simpler design, in that only a single clamping device D1 and frequency compensating device C1 need be added to the circuit. Moreover, since no NFET inverting amplifier devices are used in this embodiment, there is no need for additional load resistors associated therewith. Again, in this case the loop is pre-biased so that the range is not restricted. This can be accomplished in this embodiment by increasing the size of M7 slightly with respect to M3 and M4.

Figure 4:
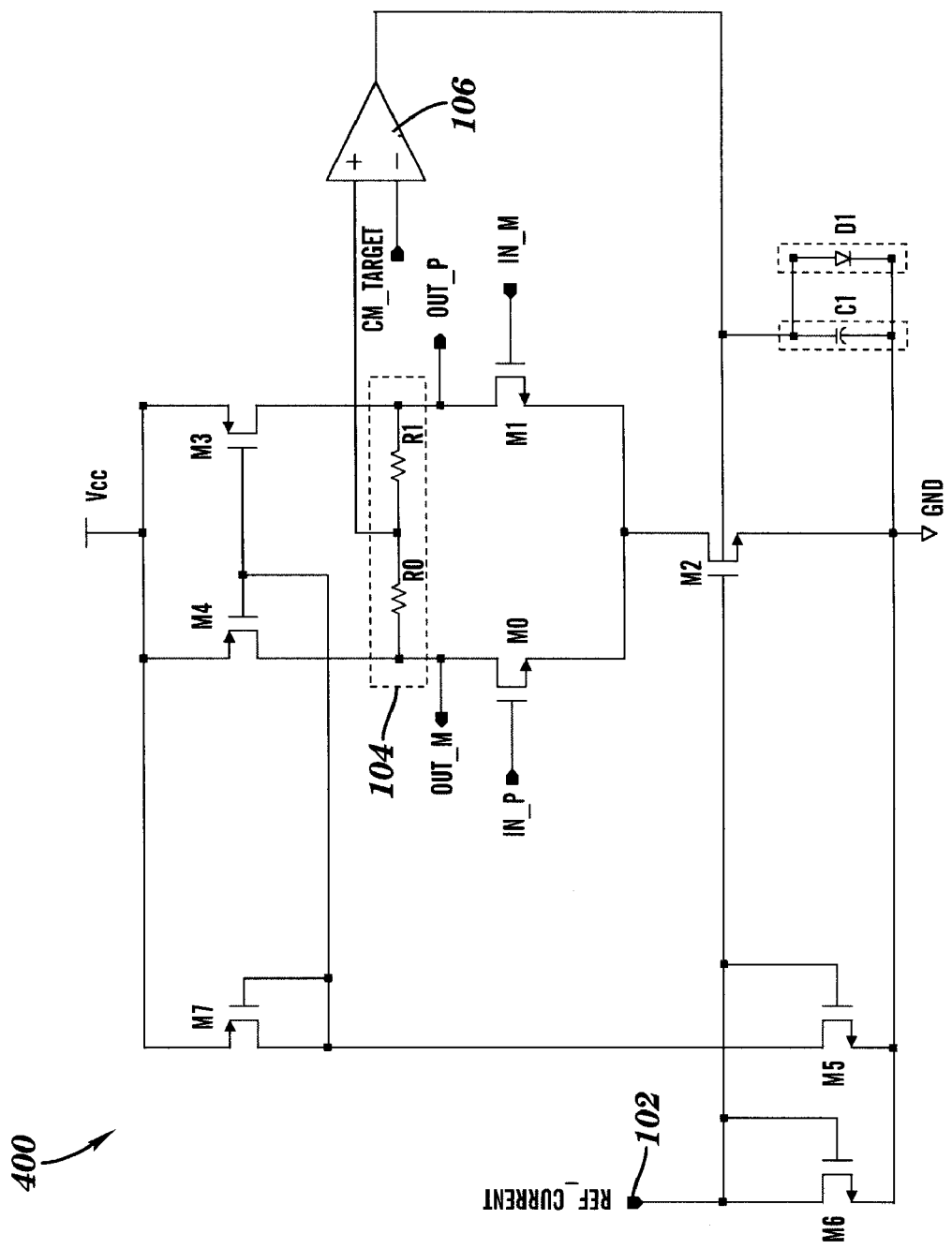
FIG. 4 is a schematic diagram of an alternative embodiment of the fully differential amplifier of FIGS. 2–3.

Referring now to FIG. 4, there is shown a schematic diagram of another fully differential amplifier 400, in accordance with an alternative embodiment of the invention. In this embodiment, the output of the common-mode error operational amplifier 106 is also used to control the body potential of the NFET bias current mirror device M2. This also provides a simpler design with respect to the embodiment of FIG. 2, in that (again) only a single clamping device D1 and frequency compensating device C1 need be added to the circuit. Pre-bias of the loop in this embodiment is achieved by making M2 slightly larger.

Figure 5:
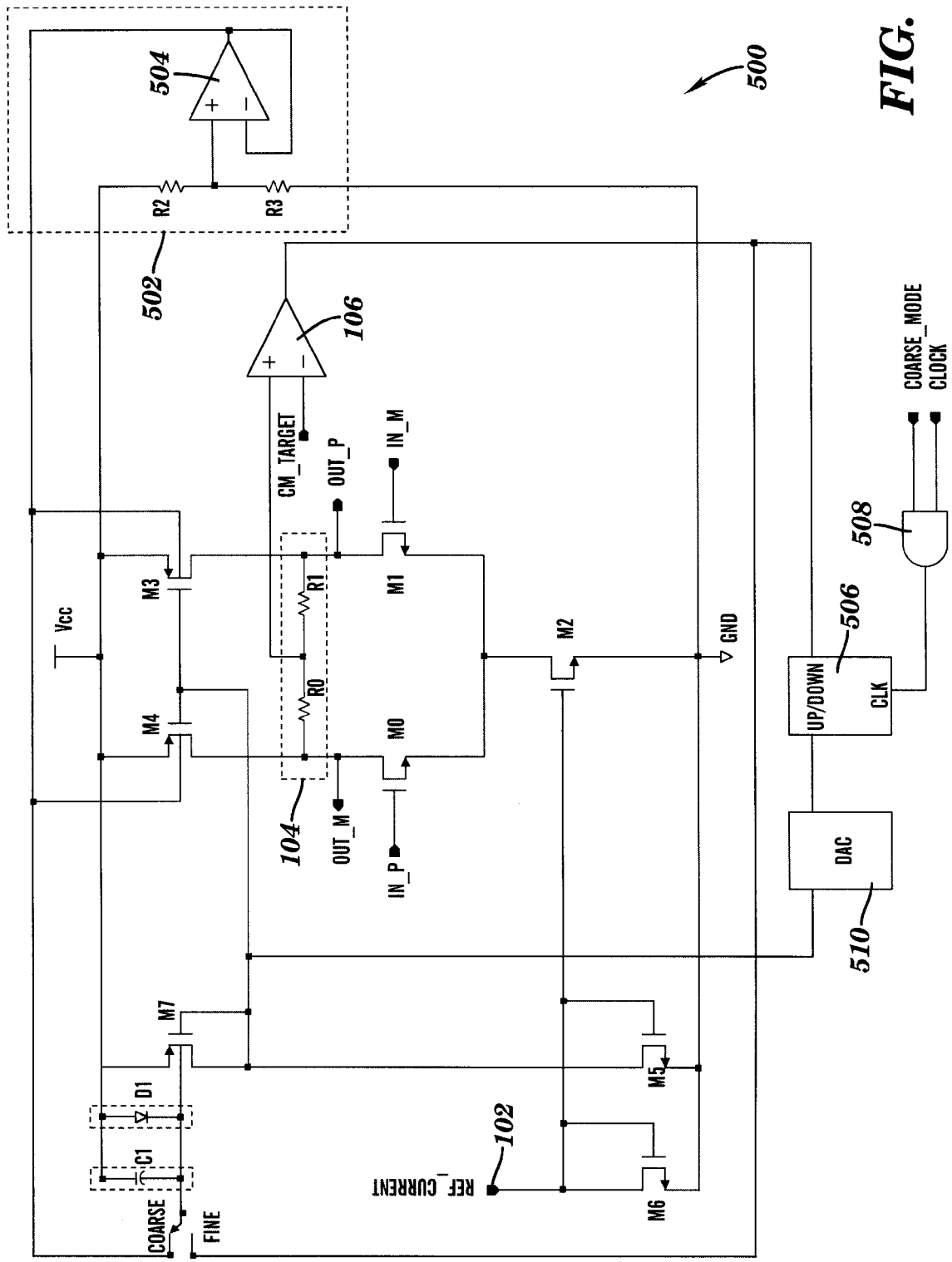
FIG. 5 is a schematic diagram of still another alternative embodiment of the fully differential amplifier of FIGS. 2–4.

Finally, FIG. 5 is a schematic diagram of still another embodiment of a method and structure for controlling the common-mode output voltage of a fully differential amplifier. The fully differential amplifier 500 of FIG. 5 provides a dual level of common-mode voltage control, through coarse/fine level adjustment, for enhancement of bi-directional adjustment (i.e., adjusting the common-mode output voltage in both positive and negative directions).

As is shown in FIG. 5, a body reference voltage generator 502 is used to generate a suitable body voltage to be continuously applied to the amplifier PFETs M4 and M3 and selectively to M7. The body reference voltage may be chosen, for example, to be about halfway between the positive supply ($V_{CC}$) and the desired clamp level in order to prevent forward biasing of the body-diffusion junctions of the PFETs. In particular, the generation of this bias level in the body reference voltage generator 502 is accomplished by the resistor pair R2, R3 and buffer op-amp 504. The output of op-amp 504, configured as a voltage follower, sets the body voltage of M4 and M3 to the value defined by resistor pair R2, R3. It is also noted that the body reference voltage is also selectively applied to the body of PFET M7 whenever the amplifier 500 is in a first or "coarse" mode of operation.

Moreover, in the coarse mode of operation, the common-mode error operational amplifier 106 is disconnected from an analog feedback loop (similar to the feedback loop of FIG. 3), and is instead used as a comparator in a digital feedback loop. More specifically, common-mode error operational amplifier 106 is used as a comparator to control the direction of a digital up/down counter 506 (or, alternatively, a more sophisticated successive approximation, averaging, or other calibration engine), thus resulting in an n-bit binary word at the output of the counter 506. It will be noted that the internal clock of up/down counter 506 is gated through the use of an AND gate 508 having by a coarse mode control signal and an external clock signal as inputs thereto. Thus, when the coarse mode is not asserted, the value of the counter 506 remains constant, independent of the state of the op amp/comparator output.

The n-bit counter word generated by up/down counter 506 is coupled to a digital-to-analog converter (DAC) 510, the output of which contributes current along with current source M5 to the current mirror reference device M7 that biases the PFET loads in the main amplifier. It will be noted that the dimensions of the PFET mirror devices may be adjusted slightly so that the circuit is nominally balanced at the midpoint of the n-bit word count and the output range of the DAC 510.

Once a steady state condition with respect to the coarse calibration phase reached, the up/down counter value is nominally within ½ of a DAC least significant bit (LSB) of the count that is required at the DAC input to balance the circuit. At this point, the output of the counter 506 is held at its present value, and the common-mode control loop is then switched over to a second or "fine" analog mode of operation. In this mode, the output of common-mode error operational amplifier 106 is used in an analog feedback loop to control the body of PFET M7 so that the common-mode target voltage is precisely achieved. In other words, the body of M7 is disconnected from the output of the body reference generator 502 and coupled to the output of the common-mode error operational amplifier 106.

While the invention has been described with reference to a preferred embodiment or embodiments, it will be understood by those skilled in the art that various changes may be made and equivalents may be substituted for elements thereof without departing from the scope of the invention. In addition, many modifications may be made to adapt a particular situation or material to the teachings of the invention without departing from the essential scope thereof. Therefore, it is intended that the invention not be limited to the particular embodiment disclosed as the best mode contemplated for carrying out this invention, but that the invention will include all embodiments falling within the scope of the appended claims.

The invention claimed is:

1. A method for controlling the common-mode output voltage in a fully differential amplifier, the method comprising:
    comparing a sensed common-mode output voltage of the fully differential amplifier to a reference voltage;
    generating an error signal representing the difference between said sensed common-mode output voltage and said reference voltage;
    utilizing said error signal to control the body voltage of one or more FET devices included within the fully differential amplifier until said sensed common-mode output voltage is in agreement with said reference voltage; and
    clamping said one or more FET devices so as to prevent activation of body-to-diffusion diodes therein.

2. The method of claim 1, further comprising configuring a frequency compensating device in communication with said one or more FET devices so as to set a dominant pole in a feedback loop defined by said error signal and said one or more FET devices.

3. The method of claim 1, wherein said one or more FET devices further comprise a pair of PFET load devices coupled to a respective pair of output terminals of the fully differential amplifier.

4. The method of claim 1, wherein said one or more FET devices further comprise a PFET device included in a reference current mirror of the fully differential amplifier.

5. The method of claim 1, wherein said one or more FET devices further comprise an NFET device included in a bias current mirror of the fully differential amplifier.

6. An apparatus for controlling the common-mode output voltage in a fully differential amplifier, comprising:
    a sensing scheme for determining a sensed common-mode output voltage of the fully differential amplifier;
    an error amplifier for comparing said sensed common-mode output voltage to a reference voltage, said error amplifier configured to generate an error signal representing the difference between said sensed common-mode output voltage and said reference voltage; and
    said error signal coupled to a body terminal of one or more FET devices included within the fully differential amplifier so as to control the body voltage thereof until said sensed common-mode output voltage is in agreement with said reference voltage; and
    a clamping device coupled to said one or more FET devices so as to prevent activation of body-to-diffusion diodes therein.

7. The apparatus of claim 6, further comprising a frequency compensating device coupled to said one or more FET devices so as to set a dominant pole in a feedback loop defined by said error signal and said one or more FET devices.

8. The apparatus of claim 6, wherein said one or more FET devices further comprise a pair of PFET load devices coupled to a respective pair of output terminals of the fully differential amplifier.

9. The apparatus of claim 6, wherein said one or more FET devices further comprise a PFET device included in a reference current mirror of the fully differential amplifier.

10. The apparatus of claim 6, wherein said one or more FET devices further comprise an NFET device included in a bias current mirror of the fully differential amplifier.

11. The apparatus of claim 6, wherein said clamping device comprises a diode.

12. The apparatus of claim 7, wherein said frequency compensating device comprises a capacitor.

13. A method for controlling the common-mode output voltage in a fully differential amplifier, the method comprising:

comparing a sensed common-mode output voltage of the fully differential amplifier to a reference voltage;

generating an error signal representing the difference between said sensed common-mode output voltage and said reference voltage;

utilizing said error signal as an input to a coarse feedback loop, said coarse feedback loop coupled to a reference current mirror in the fully differential amplifier; and utilizing said error signal as an input to a fine feedback loop, said fine feedback loop configured to control the body voltage of one or more FET devices included within said reference current mirror until said sensed common-mode output voltage is in agreement with said reference voltage.

14. The method of claim 13, wherein said coarse feedback further comprises a digital up/down counter having said error signal as an input thereto, said up/down counter generating an n-bit binary word inputted to a digital-to-analog (DAC) converter, said DAC in turn generating an output coupled to said reference current mirror in the fully differential amplifier.

15. The method of claim 14, further comprising:

generating a body reference voltage;

said body reference voltage coupled to body terminals of a pair of PFET load devices in turn coupled to a respective pair of output terminals of the fully differential amplifier; and said body reference voltage further coupled to a body terminal of a PFET device included in said reference current mirror when the fully differential amplifier is in a coarse feedback mode of operation.

16. The method of claim 15, wherein said body reference voltage is decoupled from said body terminal of said PFET device included in said reference current mirror when the fully differential amplifier is in a fine feedback mode of operation.

17. The method of claim 15, wherein said body reference voltage is generated through a resistive divider and an operational amplifier configured as a voltage follower.

18. The method of claim 13, further comprising clamping said reference current mirror so as to prevent activation of body-to-diffusion diodes therein.

19. The method of claim 18, further comprising configuring a frequency compensating device in communication with said reference current mirror so as to set a dominant pole in said fine feedback loop.

20. An apparatus for controlling the common-mode output voltage in a fully differential amplifier, comprising:

a sensing scheme for determining a sensed common-mode output voltage of the fully differential amplifier;

an error amplifier for comparing said sensed common-mode output voltage to a reference voltage, said error amplifier configured to generate an error signal representing the difference between said sensed common-mode output voltage and said reference voltage;

said error signal utilized as an input to a coarse feedback loop, said coarse feedback loop coupled to a reference current mirror in the fully differential amplifier; and said error signal further utilized as an input to a fine feedback loop, said fine feedback loop configured to control the body voltage of one or more FET devices included within said reference current mirror until said sensed common-mode output voltage is in agreement with said reference voltage.

21. The apparatus of claim 20, wherein said coarse feedback further comprises a digital up/down counter having said error signal as an input thereto, said up/down counter generating an n-bit binary word inputted to a digital-to-analog (DAC) converter, said DAC in turn generating an output coupled to said reference current mirror in the fully differential amplifier.

22. The apparatus of claim 21, further comprising:

a body reference voltage generator;

an output of said body reference voltage generator coupled to body terminals of a pair of PFET load devices in turn coupled to a respective pair of output terminals of the fully differential amplifier; and said output of said body reference voltage generator further coupled to a body terminal of a PFET device included in said reference current mirror when the fully differential amplifier is in a coarse feedback mode of operation.

23. The apparatus of claim 22, wherein said body reference voltage is decoupled from said body terminal of said PFET device included in said reference current mirror when the fully differential amplifier is in a fine feedback mode of operation.

24. The apparatus of claim 22, wherein said body reference voltage is generated through a resistive divider and an operational amplifier configured as a voltage follower.

25. The apparatus of claim 20, further comprising a clamping device to said reference current mirror so as to prevent activation of body-to-diffusion diodes therein.

26. The apparatus of claim 25, further comprising a frequency compensating device in communication with said reference current mirror so as to set a dominant pole in said fine feedback loop.

* * * * *